(12) United States Patent
Parish et al.

(10) Patent No.: US 12,666,536 B2
(45) Date of Patent: Jun. 23, 2026

(54) EMBEDDED MAGNETIC COMPONENT DEVICE INCLUDING VENTED CHANNELS AND MULTILAYER WINDINGS

(71) Applicant: Murata Manufacturing Co., Ltd., Nagaokakyo (JP)

(72) Inventors: Scott Andrew Parish, Milton Keynes (GB); Takayuki Tange, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 128 days.

(21) Appl. No.: 18/565,412

(22) PCT Filed: Jun. 15, 2022

(86) PCT No.: PCT/US2022/033601
§ 371 (c)(1),
(2) Date: Nov. 29, 2023

(87) PCT Pub. No.: WO2022/266205
PCT Pub. Date: Dec. 22, 2022

(65) Prior Publication Data
US 2024/0260196 A1 Aug. 1, 2024

Related U.S. Application Data

(60) Provisional application No. 63/210,805, filed on Jun. 15, 2021.

(51) Int. Cl.
*H05K 1/182* (2026.01)
*H01F 27/24* (2006.01)
(Continued)

(52) U.S. Cl.
CPC ............. *H05K 1/182* (2013.01); *H01F 27/24* (2013.01); *H05K 3/30* (2013.01); *H05K 3/4038* (2013.01)

(58) Field of Classification Search
CPC ........ H05K 1/182; H05K 3/30; H05K 3/4038; H01F 27/24
(Continued)

(56) References Cited

U.S. PATENT DOCUMENTS 7,489,226 B1 2/2009 Chignola et al.
10,194,526 B1 1/2019 Simula et al.
(Continued)

FOREIGN PATENT DOCUMENTS

CN 105529156 A * 4/2016 ........... H01F 27/324
CN 105931814 A 9/2016
(Continued)

OTHER PUBLICATIONS

Official Communication issued in International Patent Application No. PCT/US2022/033601, mailed on Oct. 7, 2022.
(Continued)

*Primary Examiner* — Andargie M Aychillhum
(74) *Attorney, Agent, or Firm* — Keating & Bennett, LLP

(57) ABSTRACT

A device includes an insulating substrate including a cavity and a magnetic core in the cavity. The insulating substrate includes a first opening and a second opening that connect the cavity to an exterior of the insulated substrate. The first opening and the second opening are provided on a same side of the magnetic core.

6 Claims, 12 Drawing Sheets

(51) Int. Cl.
      *H05K 3/30*          (2006.01)
      *H05K 3/40*          (2006.01)
(58) Field of Classification Search
      USPC ......................................................... 174/260
      See application file for complete search history.

(56)                    References Cited

U.S. PATENT DOCUMENTS

| | | |
|---|---|---|
| 2011/0108317 A1 | 5/2011 | Harrison et al. |
| 2014/0151104 A1 | 6/2014 | Chung et al. |
| 2016/0254088 A1 | 9/2016 | Kneller et al. |

FOREIGN PATENT DOCUMENTS

| | | | | |
|---|---|---|---|---|
| CN | 112640586 A | | 4/2021 | |
| GB | 2549770 A | * | 11/2017 | ......... H01F 27/2804 |
| KR | 10-2014-0071769 A | | 6/2014 | |
| KR | 10-2021-0049109 A | | 5/2021 | |

OTHER PUBLICATIONS

Official Communication issued in corresponding Chinese Patent Application No. 202280042042.4, mailed on Mar. 25, 2026, 7 pages.

* cited by examiner

1400

1402

1403

1403

1401

1401

1452

1403

1400

CORE

1401

1310

1401

1403

DICING LINES

1600

DICING LINES

EMBEDDED MAGNETIC COMPONENT DEVICE INCLUDING VENTED CHANNELS AND MULTILAYER WINDINGS

BACKGROUND OF THE INVENTION

1. Field of the Invention

The present invention relates to embedded magnetic component devices. More specifically, the present invention relates to embedded magnetic component devices including vent channels and multilayer windings.

2. Description of the Related Art

Power supply devices, such as transformers and converters, involve magnetic components, such as transformer windings and often magnetic cores. The magnetic components typically contribute the most to the weight and size of the device, making miniaturization and cost reduction difficult.

In addressing this problem, it is known to provide low profile transformers and inductors in which the magnetic components are embedded in a cavity in a resin substrate, and the necessary input and output electrical connections for the transformer or inductor are formed on the substrate surface. A printed circuit board (PCB) for a power supply device can then be formed by adding layers of solder resist and copper plating to the top and/or bottom surfaces of the substrate. The necessary electronic components for the device may then be surface mounted on the PCB. This allows a significantly more compact and thinner device to be built.

For example, a packaged structure having a magnetic component can be integrated into a printed circuit board. In this structure, a cavity is formed in an insulating substrate made of epoxy-based glass fiber and a toroidal magnetic core is inserted into the cavity. The remaining space in the cavity is then filled with an epoxy gel so that the magnetic component is fully covered. The epoxy gel is then cured, forming a solid substrate having an embedded magnetic core.

Through-holes for forming primary and secondary windings are then drilled in the solid substrate on the inside and outside circumferences of the toroidal magnetic component. The through-holes are then plated with copper, to form vias, and metallic traces are formed on the top and bottom surfaces of the solid substrate to connect respective vias together into a winding configuration and to form input and output terminals. In this way, a coil conductor is created around the magnetic component. The coil conductor is for an embedded transformer and has primary and secondary windings. An embedded inductor can be formed in the same way but may vary in terms of the input and output connections, the spacing of the vias, and the type of magnetic core used.

Devices manufactured in this way have a number of associated problems. In particular, air bubbles may form in the epoxy gel as it is solidifying. During reflow soldering of the electronic components on the surface of the substrate, these air bubbles can expand and cause failure in the device. Additionally, mechanical stresses introduced by differences between the coefficient of thermal expansions of the magnetic core, the epoxy gel, and the substrate can cause the magnetic core to crack.

To circumvent this problem, a device structure can be made in which epoxy gel is not used to fill the cavity and an air gap is maintained between the magnetic core and the sides of the cavity. In this case, the spacing between the primary and secondary windings must be large to achieve a high isolation value, because the isolation is only limited by the dielectric strength of the air, in this case in the cavity or at the top and bottom surfaces of the device. The isolation value may also be adversely affected by contamination of the cavity or the surface with moisture and/or dirt.

To minimize contamination of the cavity, a circuit board package structure 100 for embedded magnetic component devices has been proposed in Taiwanese Patent Application TWM471030 where the cavity is vented to the exterior of the embedded magnetic component device. For example, FIG. 1 shows a mother substrate 110 that includes annular cavities 116, each including a circular magnetic component 130. As shown, the annular cavities 116 are connected to each other by channels or slots 118 in the direction D1. After magnetic components 130 are placed in the annular cavities 116, the mother substrate 110 is cut along line segments, e.g., lines L1-L4, to create individual device substrates having an area A1. Cutting the connecting channels 118 along line segments L1 and L2 creates an air path between the annular cavity 116 and the exterior of the device substrate in the individual device substrates as shown in FIG. 2.

FIG. 2 shows an example of an insulating substrate 301 of an individual embedded magnetic component device. As shown, the insulating substrate 301 includes a cavity 302 and two channels 303 formed between the circular cavity 302 and the exterior edges of the substrate 301. The channels 303 create openings or vents to allow air to flow between the cavity 302 and the exterior of the substrate 301. The presence of the channels 303 means that air can flow into and out of the cavity 302 during the subsequent stages of manufacturing of the embedded magnetic component device. As a result, there is a considerable reduction in the possibility of forming voids that can cause damage to the embedded magnetic component device during adhesive-curing and later reflow-soldering stages of manufacture. Furthermore, when the embedded magnetic component device is complete, the channels 303 and air gap in the cavity 302 aid with cooling of the embedded magnetic component device during operation.

However, an embedded magnetic component device formed using the substrate 301 shown in FIG. 2 has inherent problems. For example, FIGS. 3 and 15 show that the channels 303 reduce the area of the substrate that can be used to locate through holes or vias 411, 412, 421, 422 that connect metal traces 413, 423 (shown in FIG. 3 but not FIG. 15) of the primary and secondary windings 410 and 420. Increasing the amount of turns in a winding requires more though holes and may require that the substrate size be increased to accommodate the added area needed. Additionally, the substitution of air for insulating material of the substrate 301 necessary to form the channels 303 reduces the dielectric strength in the channel areas. With less dielectric strength against high voltage, the channels 303 of air can become a creepage path and/or a clearance path. The isolation value may also be adversely affected by contamination of the cavity or the surface with dirt. Therefore, more space may be required between the magnetic core and the windings.

To meet the insulation requirements of EN/UL60950, an isolation distance of 0.4 mm is required through a solid insulator for mains referenced voltages (i.e., 250 Vrms), for example. FIG. 3 is a top view of an embedded magnetic component device with the upper winding layer exposed. The primary winding 410 of the transformer is shown on the left-hand side, and the secondary winding 420 of the transformer is shown on the right-hand side. In an isolated DC-DC converter, for example, the primary winding 410 and the secondary winding 420 of the transformer must be sufficiently isolated from one another. In FIG. 3, the central region of the substrate 305, the region circumscribed by the inner wall of the core cavity (shown by the concentric dotted circles) defines an isolation region 430 between the primary and the secondary windings. The minimum distance between the inner vias 412 and 422 of the primary and secondary windings 410 and 420 is the isolation distance and is illustrated in FIG. 3 by arrow 432.

However, the embedded magnetic component device shown in FIG. 3 has problems with coupling between the primary and secondary windings and with high leakage inductance. In operation, a large leakage inductance causes a voltage surge that can result in damage to connected circuitry, including the switching components. Additionally, leakage inductance causes a power transfer delay and poor load regulation when the circuit is operating at high frequency. The space inside the core is limited, and the device size would need to increase if more winding turns and corresponding through holes are needed, while maintaining the minimum isolation distance.

SUMMARY OF THE INVENTION

To overcome the problems described above, preferred embodiments of the present invention provide embedded magnetic component devices each with improved isolation characteristics. The embedded magnetic component devices can include one or more of the following features:

1) first and second electrical windings in which the first electrical winding is closer to the magnetic core than the second electrical winding;

2) vents opened at a same side of the magnetic core; and 3) side nodes that provide electrical connections.

Preferred embodiments of the present invention also provide methods of making such embedded magnetic component devices. Preferred embodiments of the present invention provide mother substrates from which the individual substrates of embedded magnetic component devices can be made and methods of making such individual substrates.

According to a preferred embodiment of the present invention, an embedded magnetic component device includes an insulating substrate including a cavity and a magnetic core in the cavity. The insulating substrate includes a first opening and a second opening that connect the cavity to an exterior of the insulated substrate, and the first opening and the second opening are provided on a same side of the magnetic core.

The first opening and the second opening can be provided along a same edge of the insulating substrate. A side node can be located on an edge of the substrate. The side node can include an electrically conductive material. A cover can be disposed over a first end of the side node. The embedded magnetic component device can further include an encapsulant provided on the insulating substrate.

According to a preferred embodiment of the present invention, a method of manufacturing an embedded magnetic component device includes forming a cavity in an insulating substrate, forming a first channel between the cavity and a first edge of the insulating substrate, forming a second channel between the cavity and the first edge of the insulating substrate, and installing a magnetic core in the cavity.

The method can further include forming an electrically conductive hole in the insulating substrate. The method can further include forming a cover on the insulating substrate that covers the electrically conductive hole. The method can further include cutting the insulating substrate and the cover along a line that passes through the electrically conductive hole.

The above and other features, elements, characteristics, steps, and advantages of the present invention will become more apparent from the following detailed description of preferred embodiments of the present invention with reference to the attached drawings.

DETAILED DESCRIPTION OF THE PREFERRED EMBODIMENTS

Figure 4:
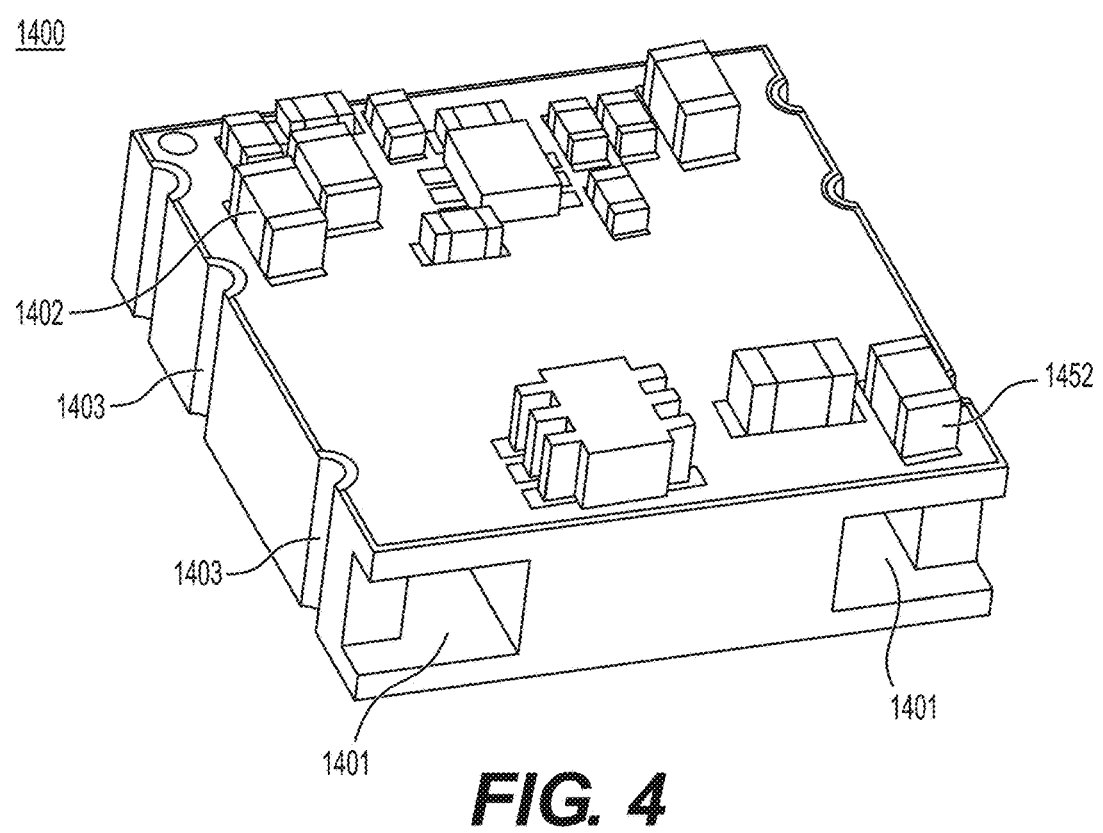
FIG. 4 shows a circuit module according to a preferred embodiment of the present invention.

FIG. 4 shows an example of a circuit module 1400 according to a preferred embodiment of the present invention. The circuit module 1400 can include two or more vents 1401. In FIG. 4, the circuit module 1400 includes a primary-side circuit 1402 and a secondary-side circuit 1452. The vents 1401 can be located on the same side of the circuit module 1400 as the secondary-side circuit 1452. In some applications, the primary-side circuit 1402 and the secondary-side circuit 1452 can be switched so that, for example, in FIG. 4, reference number 1402 refers to the secondary-side circuit and reference number 1452 refers to the primary side-circuit. The circuit module 1400 can also include one or more side nodes 1403 that provide electrical connection(s) to one or more external devices, including, for example, a mother board substrate. The one or more side nodes 1403 may be castellated holes, as described below with respect to FIG. 14.

Figure 5:
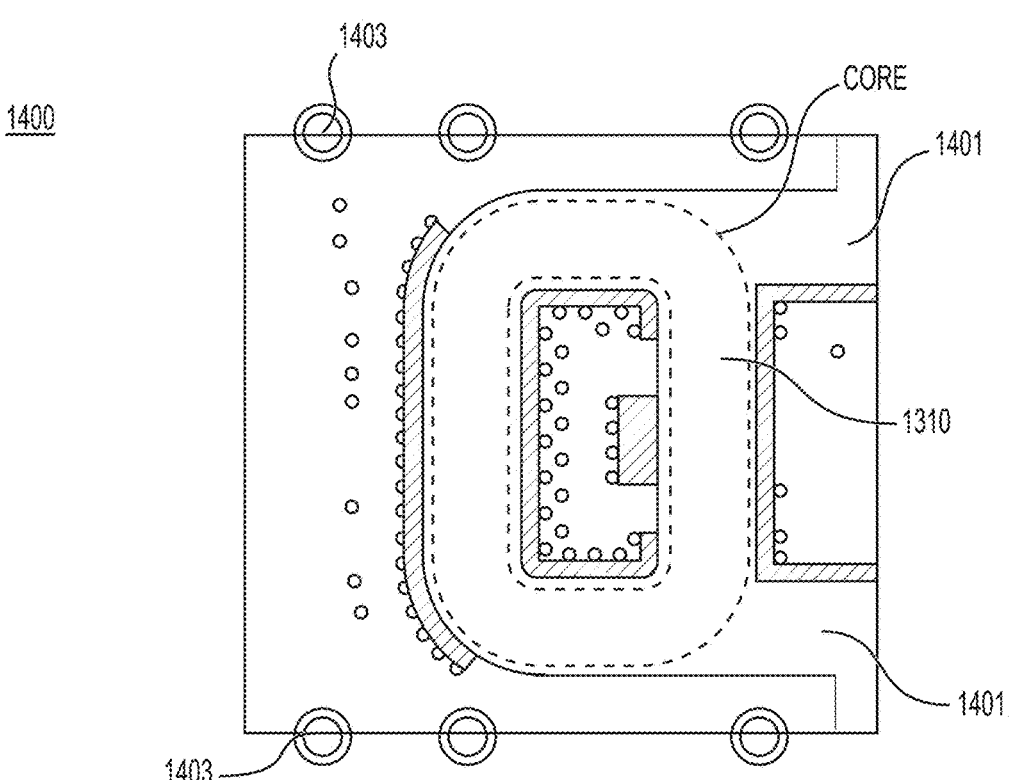
FIG. 5 shows a sectional plan view of the circuit module shown in FIG. 4.
Figure 6:
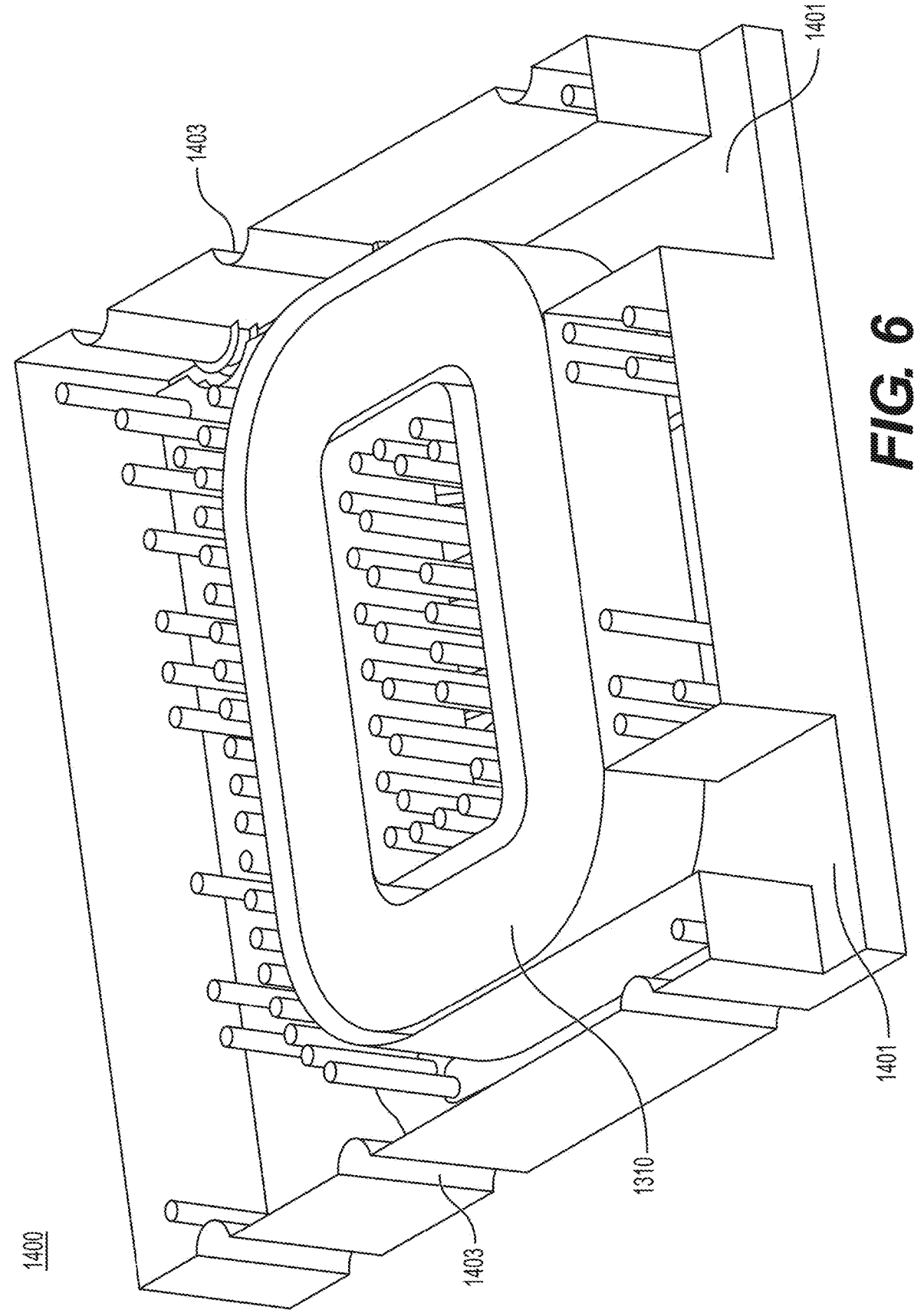
FIG. 6 shows a sectional perspective view of the circuit module shown in FIG. 4.

FIG. 5 shows a sectional plan view of the circuit module 1400 shown in FIG. 4, and FIG. 6 shows a sectional perspective view of the circuit module 1400 shown in FIG.

4. As shown in FIGS. 5 and 6, a magnetic core 1310 is provided within the circuit module 1400, and the vents 1401 are connected to a cavity of the circuit module 1400 that includes the magnetic core 1310.

Figure 16:
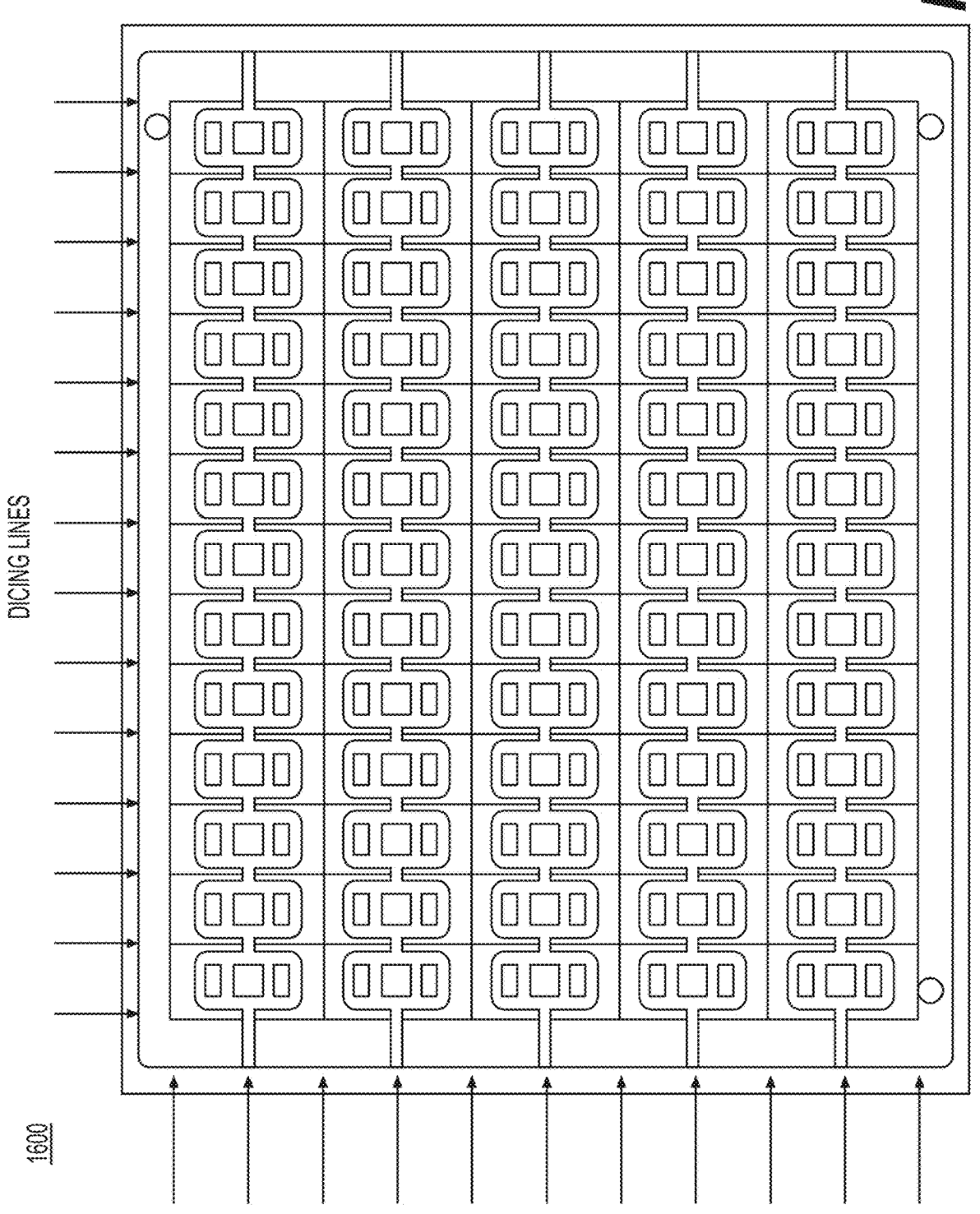
FIG. 16 shows dicing lines of a mother substrate that can be used to manufacture a circuit module with two vents on the same side.

FIG. 16 shows dicing lines of a mother substrate 1600 that can be used to create the circuit module 1400 with two vents 1401 on one side of the circuit module 1400 by cutting the mother substrate 1600 along the dicing lines. Any suitable method can be used to cut the mother substrate 1600.

Figure 1:
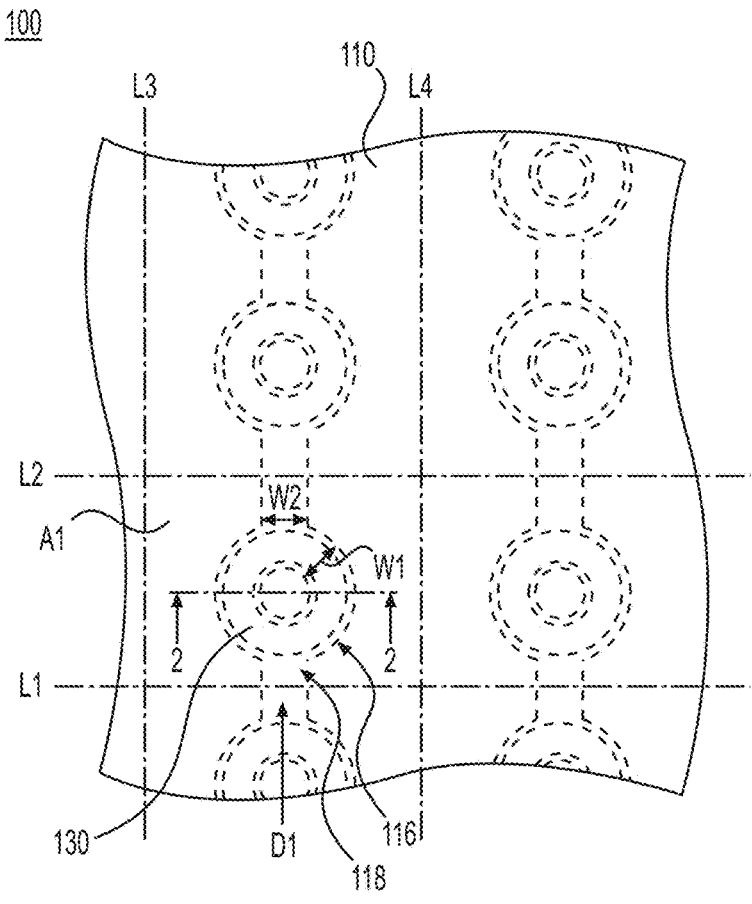
FIGS. 1 and 2 show a configuration of a substrate for an embedded magnetic component device of the related art.
Figure 2:
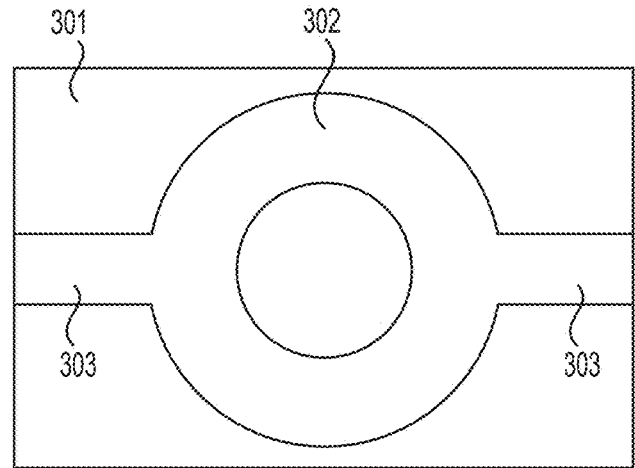

In contrast to the two channels 303 formed between the circular cavity 302 and the exterior edges of the substrate 301 shown in FIG. 2, which are located on opposite edges of the substrate 301, the vents 1401 are provided on a same side of the circuit module 1400 as shown in FIGS. 4-6. Thus, the vents 1401 are able to be located only on the secondary side of the circuit module 1400. Accordingly, in contrast to the structure shown in FIG. 2, the vents 1401 of the circuit module 1400 shown in FIGS. 4-6 can be designed without considering creepage distance from primary conductors to secondary conductors through the magnetic core 1310 because the two vents 1401 are located on the same side of the circuit module 1400.

Furthermore, by including two or more vents 1410 in the circuit module 1400, a risk of delamination and blistering of the circuit module 1400 can be significantly reduced. For example, a circuit module that includes only a single vent may trap air during a process of laminating the circuit module, which can result in delamination and blistering when the circuit module is heated. In addition, including two or more vents 1410 in the circuit module 1400 also reduces problems, such as cracking, which can be caused by a difference in the coefficient of thermal expansion between the magnetic core 1310 and a filling or encapsulating material (for example, resin) that is introduced into the cavity of the circuit module 1400.

FIGS. 7-10 show an example of an embedded magnetic component device with multilayer windings, which can be included in the circuit module 1400 shown in FIG. 4. The multilayer windings include a primary winding 720 and a secondary winding 730 wrapped around one side of a magnetic core 710.

Figure 7:
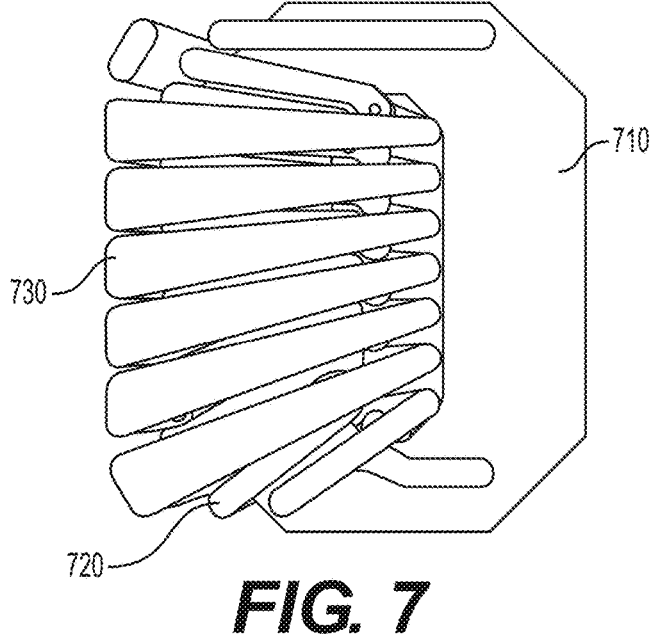
FIGS. 7-10 show an embedded magnetic component device with windings wrapped around one side of a magnetic core, which can be included in the circuit module shown in FIG. 4.

FIG. 7 shows an embedded transformer with multi-layer windings that includes a magnetic core 710, a primary winding 720, and a secondary winding 730 outside of the primary winding 720. The magnetic core 710 shown in FIG. 7 is octagonally shaped, but other shapes, including, for example, an elliptical shape or a rectangular shape can be used. If a shape with corners is used, then the corners can be sharp or rounded. For example, the magnetic core 710 can have an octagonal shape with rounded corners or can have a rectangular shape with rounded corners, for example. Each of the primary winding 720 and secondary winding 730 is defined by traces connected by vias. Although the secondary winding 730 is shown to be outside of the primary winding 720, the inner winding could be the secondary winding 730, and the outer winding could be the primary winding 720.

The primary winding 720 and the secondary winding 730 extend only around the same half of the magnetic core 710. No turns of either the primary winding 720 or the secondary winding 730 extend around the other half of the magnetic core 710. The primary winding 720 and the secondary winding 730 can have any number of turns.

The primary windings 720 can include two rows of inner vias in a hole through the magnetic core 710 and one row of outer vias on the exterior of the magnetic core 710. The secondary winding 730 can include one row of inner vias in the hole through the magnetic core 710 and one row of outer vias on the exterior of the magnetic core 710.

As shown in FIG. 7, the inner vias of the primary winding 720 and the secondary winding 730 can be arranged in three rows. But other arrangements are also possible.

As shown in FIG. 7, the row of outer vias of the primary windings 720 can be adjacent to and can extend along a portion of the periphery of the magnetic core 710. The row of outer vias of the secondary winding 730 can be adjacent to the row of outer vias of the primary winding 720 and spaced farther away from the magnetic core 710 than the row of outer vias of the primary winding. The outer vias of the primary winding 720 and the secondary winding 730 can extend along a portion of the periphery of the magnetic core 710 that is less than half of the total periphery of the magnetic core 710. For example, if the magnetic core 710 has an octagonal shape as shown in FIG. 7, then the outer vias of the primary winding 720 and the secondary winding 730 can extend along one, two, or three sides of the magnetic core 710. If the magnetic core 710 has a rectangular shape, then the outer vias of the primary winding 720 and the secondary winding 130 can extend along one side of the magnetic core 710.

The hole in the middle of the magnetic core 710 defining an inner periphery of the magnetic core 710 can have any suitable shape. For example, in FIG. 7, the inner and outer peripheries can both have the same octagonal shape. But the inner and outer peripheries can have different shapes.

As previously described, the magnetic core 710 can be installed within a cavity that can be formed in an insulating substrate. A first insulating layer can be secured or laminated on the top of the substrate to cover the cavity and the magnetic core 710. The first insulating layer can include a first metal layer used as traces of a portion of the primary winding 720 or the metal layer can be subsequently added. The bottom surface of the substrate can include a second metal layer used as traces of another portion of the primary winding 720 or the second metal layer can be subsequently added. Optionally, a second insulating layer and second metal layer can be secured to the bottom of the substrate.

Subsequently, a third insulating layer and a third metal layer can be secured or laminated on the top of the first insulating layer and used as the traces of a portion of the secondary winding 730. A fourth insulating layer and a fourth metal layer can be secured or laminated on the bottom surface of the substrate or the second insulating layer and used as the traces of another portion of the secondary winding 730.

Figure 8:
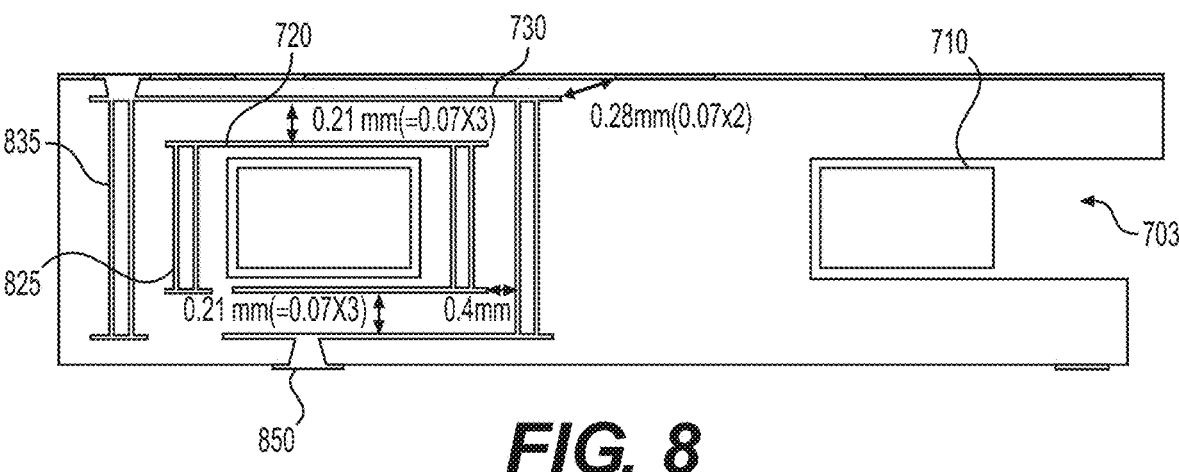

As shown in FIG. 8, additional insulating layers can be used. For example, one or more additional insulating layers can be included between the substrate and the first insulating layer, one or more additional insulating layers can be included between the first insulating layer and the third insulating layer, one or more additional insulating layers can be included between the substrate and the second insulating layer, and one or more additional insulating layers can be included between the fourth insulating layer and either the substrate or the second insulating layer. Additionally, it is possible to add additional insulating layers to the exterior of the embedded transformer to cover any exposed metal layers. Covering exposed metal layers with additional insulating layers can reduce the creepage and clearance distances between the windings of the transformer and any mounting members located on the exterior of the embedded transformer.

The added insulating layers can be formed of the same material as the substrate as this facilitates bonding between the top and the bottom surfaces of the substrate and the intermediate insulating layers. The added insulating layers can therefore be laminated onto the substrate and each other. Lamination may be performed by applying an adhesive or by performing heat activating bonding between layers of pre-preg material. The substrate and additional insulating layers can be FR4, G10, or any other suitable material. Alternatively, the added insulating layers and the substrate can include different materials.

FIG. 8 shows side sectional view of the transformer shown in FIG. 7. FIG. 8 shows that vias 825 and 835 can be provided through the substrate and the additional insulating layers to connect the top and bottom winding layers to each other. FIG. 8 shows the magnetic core 710, the primary winding 720, the secondary winding 730, vias 825 connecting the inner layers of the primary winding 720, and vias 835 connecting the outer layers of the secondary winding 730. FIG. 8 also shows a channel 703 that vents the cavity and magnetic core 710 to the exterior of the transformer. Although FIG. 8 shows the primary winding 720 and the secondary winding 730 only wrapped around the same half of the magnetic core, it is possible that one or more turns of the primary winding 720 and/or the secondary winding 730 is wrapped around the other half of the magnetic core. It is also possible to include one or more auxiliary windings. The one or more auxiliary windings can be wrapped on the same half of the magnetic core as the primary winding 720 and the secondary winding 730, or the one or more auxiliary windings can include one or more turns that is wrapped around the other half of the magnetic core.

Figure 3:
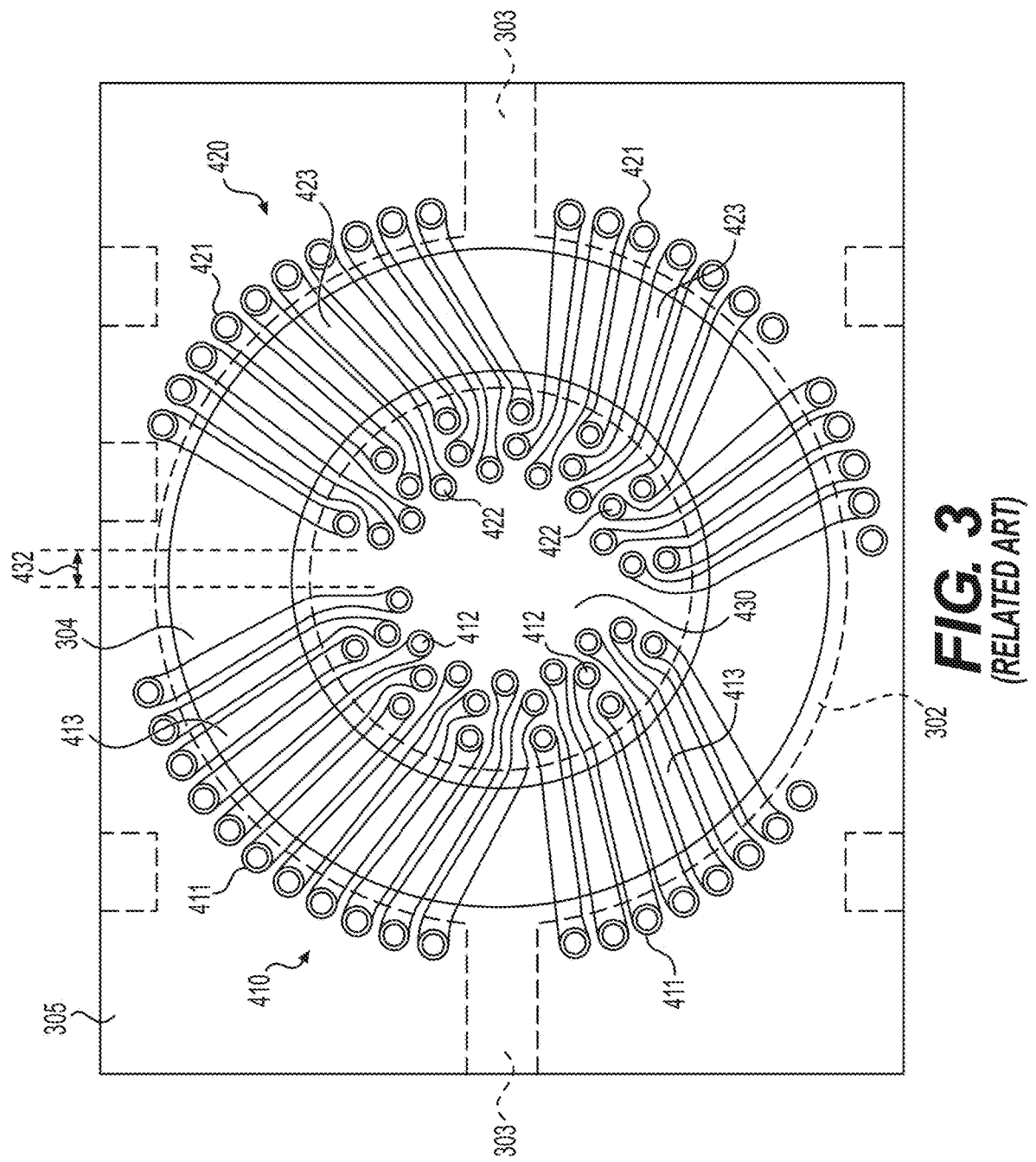
FIG. 3 shows a top down view of an embedded magnetic component of the related art.

The magnetic core 710 can be a ferrite core as this can provide the device with the desired inductance. Other types of magnetic materials, and air cores, that are unfilled cavities provided between the windings of the transformer, are also possible. Although, in the examples shown, the magnetic core 710 has an octagonal shape, it may have different shapes. The octagonal shape of the magnetic core 710 maximizes the magnetic space within the magnetic core for the induced magnetic field and the physical space for the vias 825 and 835. The magnetic core 710 can be coated with an insulating material to reduce the possibility of breakdown occurring between the conductive magnetic core 710 and the vias 825 and 835 or traces. This configuration of having the primary winding close to the secondary winding improves transformer performance characteristics of coupling, inductance, and resistance, while minimizing or decreasing the physical size of the transformer. For example, the coupling can be improved from about 0.916 from the configuration shown in FIG. 3 to about 0.991 in the configuration shown in FIGS. 7-10. Additionally, leakage inductance, and thus the resonant frequency of a resonant converter, such as the one shown in FIG. 14 that uses an embedded transformer, can be controlled by overlapping portions of the primary and secondary windings 720 and 730.

Additional winding(s) can be included on the other portion of the magnetic core 710 that does not include any windings. However, in this case, the physical size of the transformer would increase and the size of the opening through the magnetic core 710 would also need to be increased to accommodate the additional necessary through holes.

FIG. 8 also indicates exemplary dimensions of distances between the layers of the inner and outer winding layers of about 0.28 mm or about 0.21 mm and a distance between the metal layers of the primary winding 720 and the vias 735 of the secondary winding 730 of about 0.4 mm. To meet the insulation requirements of EN/UL60950, 0.4 mm separation is required through a solid insulator for mains referenced voltages (250 Vrms), for example.

If the added insulating layers and the substrate are FR4, then FIG. 8 shows the primary windings 720 and secondary windings 730 can be vertically separated (i.e., the distance between adjacent traces of the primary windings 720 and secondary windings 730) by two insulation layers with a thickness of about 0.14 mm within manufacturing and measurement tolerances (i.e., a total of about 0.28 mm within manufacturing and measurement tolerances) or can be vertically separated by three insulation layers with a thickness of about 0.07 mm within manufacturing and measurement tolerances (i.e., a total of about 0.21 mm within manufacturing and measurement tolerances). FIG. 8 also shows that the primary windings 720 and the secondary windings 730 can be horizontally separated (i.e., the shortest distance between traces or vias of the primary winding and the vias of the secondary winding) by about 0.4 mm within manufacturing and measurement tolerances.

The IEC and UL safety standards require the distances between the electric windings to be more than 0.4 mm when the windings are integrated in the same layer of a substrate. In other rules of the IEC and UL standards, a dielectric "thin film sheet" is applied to the isolation that should be secured in the vertical direction. When a material is used for the substrate with an isolation distance of 30 kV/mm, a minimum separation of 0.28 mm is required with two dielectric layers. With three dielectric layers, the minimum distance should be 0.21 mm. Accordingly, the isolation distances in the horizontal and vertical directions can be different from each other. The vias 825 and 835 are formed at suitable locations to form the primary and secondary windings 720 and 730 of the embedded transformer. Because the transformer includes a magnetic core 710 that is octagonal in shape with a corresponding octagonal-shaped opening in the center, the vias 825 and 835 are therefore suitably formed along portions of the opening and along one side of the outer circumference.

Through-holes can be formed by any combination of, for example, drilling, etching, or any other suitable process or technique. The through-holes can then be plated or otherwise metalized to form vias 825 and 835 that extend between the top and bottom traces of the corresponding primary and secondary windings 720 and 730.

Traces connecting the respective vias 825 and 835 define the windings of the transformer. The traces and the plating of the vias 825 and 835 are usually formed from copper, or other suitable metal or alloy, and can be formed in any suitable way, such as, for example, by adding a copper conductor layer to the outer surfaces of the insulating layer or substrate which is then etched to form the necessary patterns, depositing the copper onto the surface of the insulating layer or substrate, plating the copper onto the insulating layer or substrate, and so on. The width and shape of the traces forming the primary and secondary windings 820 and 830 can be configured to reduce or minimize resistance. For example, as shown, the width of the traces forming the secondary winding 730 are wider toward the outside of the trace farthest from the opening through the magnetic core 710. Additionally, as shown, there can be two vias 835 used to connect traces defining the secondary winding 730 to reduce or minimize resistance of the longer secondary winding 730. Additional vias can be used to connect the same traces, depending on the width of the traces.

Figure 9:
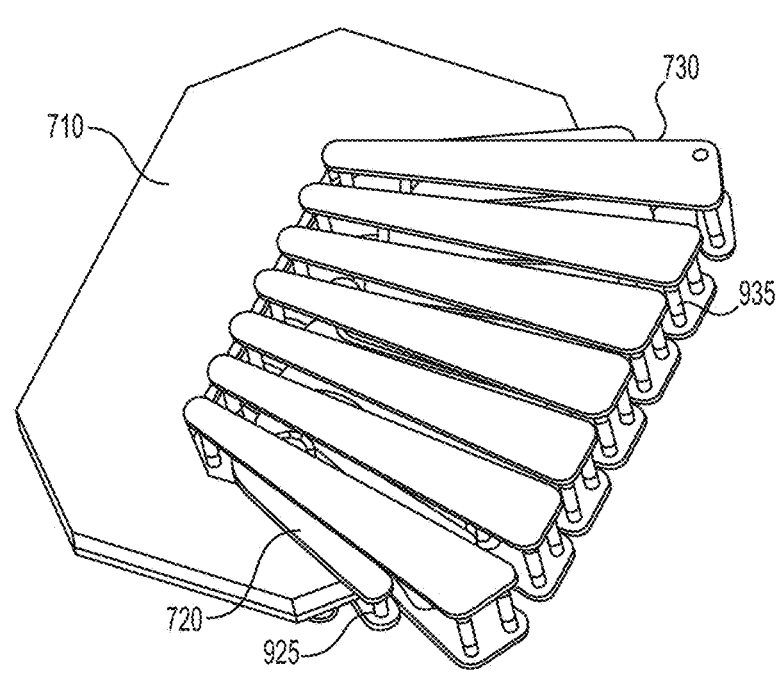
Figure 10:
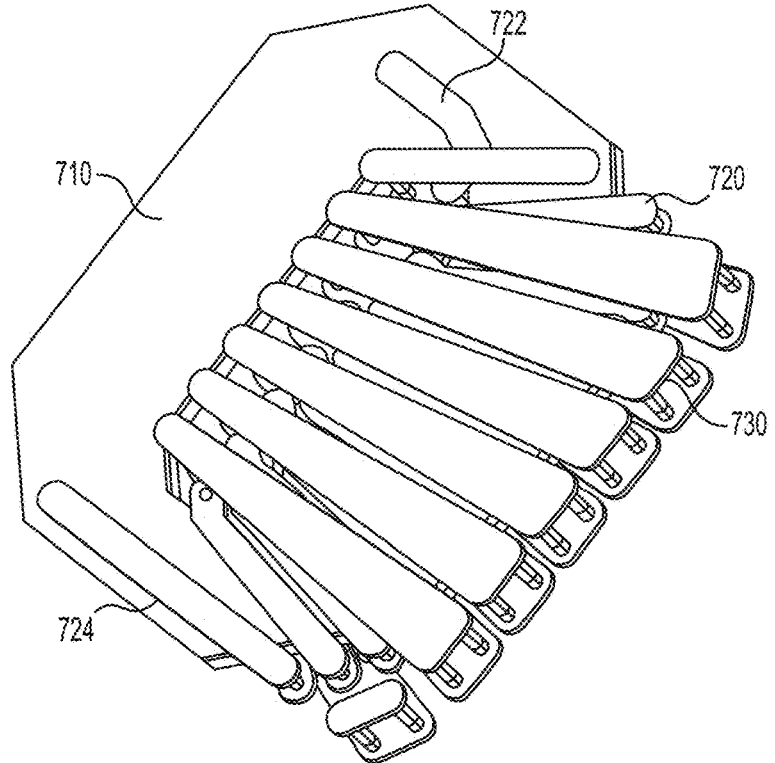

FIGS. 9 and 10 are respective top and bottom perspective views of the embedded transformer of FIG. 7 shown without the materials of the substrate or insulating layers. FIGS. 9 and 10 show the magnetic core 710, the layers of the primary winding 720, the layers of the secondary winding 730, the vias 925 of the primary winding 720, and the vias 935 of the secondary winding. The bottom view of FIG. 10 shows that the primary 720 can include winding extensions 722 and 724 that can be used to locate and provide terminals 850 to connect the primary winding 720 to circuitry, as shown in FIG. 8.

Figure 11:
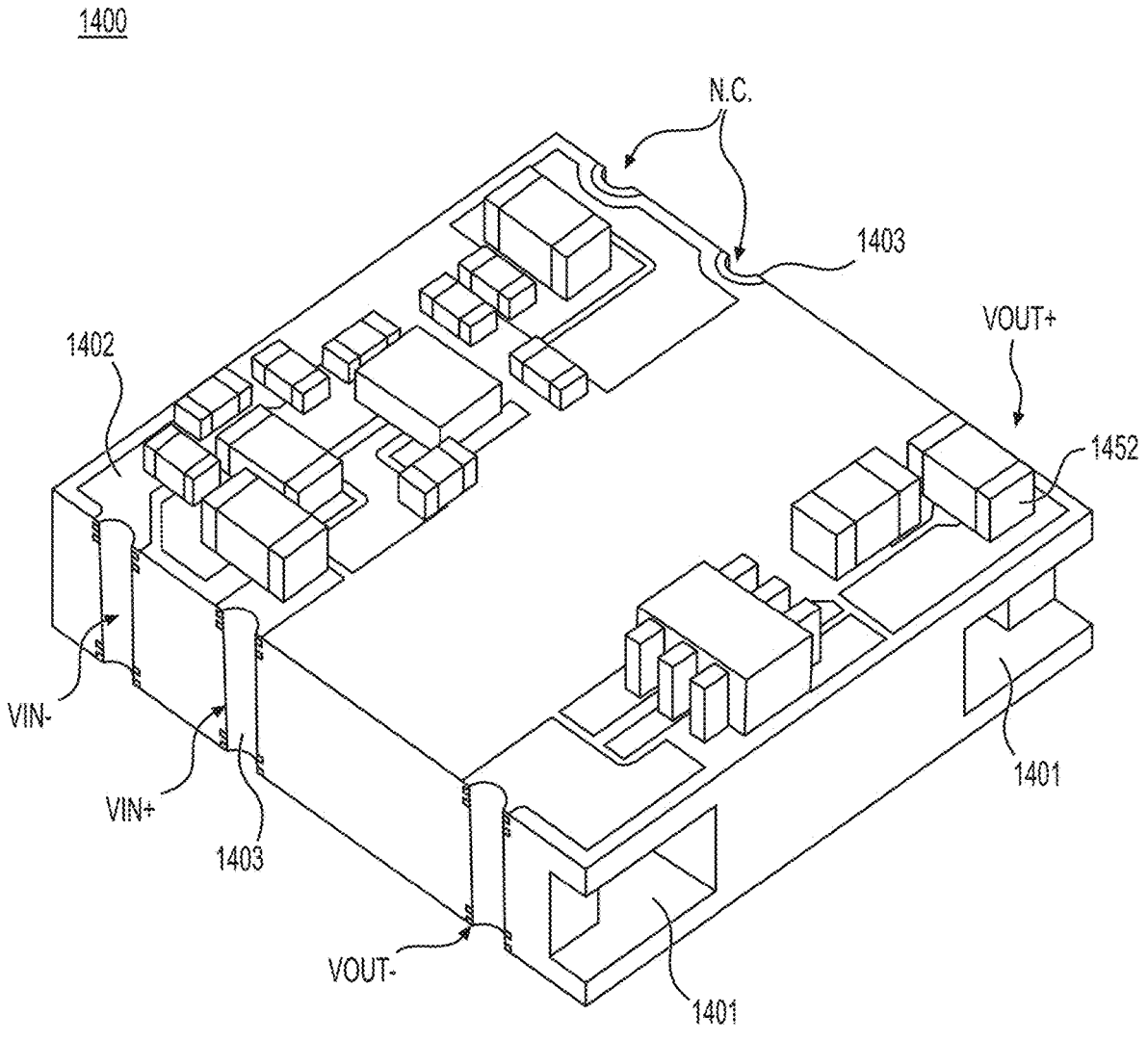
FIG. 11 shows an example of circuit connections for the circuit module shown in FIG. 4.

FIG. 11 shows an example of circuit connections for the circuit module 1400 shown in FIG. 4. As shown in FIGS. 4-6, the circuit module 1400 can also include one or more side nodes 1403 that provide electrical connection(s). As shown in FIG. 11, the side nodes 1403 can provide electrical connections that include terminals Vin+, Vin−, Vout+, and Vout− of, for example, an isolated DC-DC converter. In addition, one or more of the side nodes 1403 can be provided with no electrical connection ("N.C." or "not connected" as shown in FIG. 11).

Figure 12:
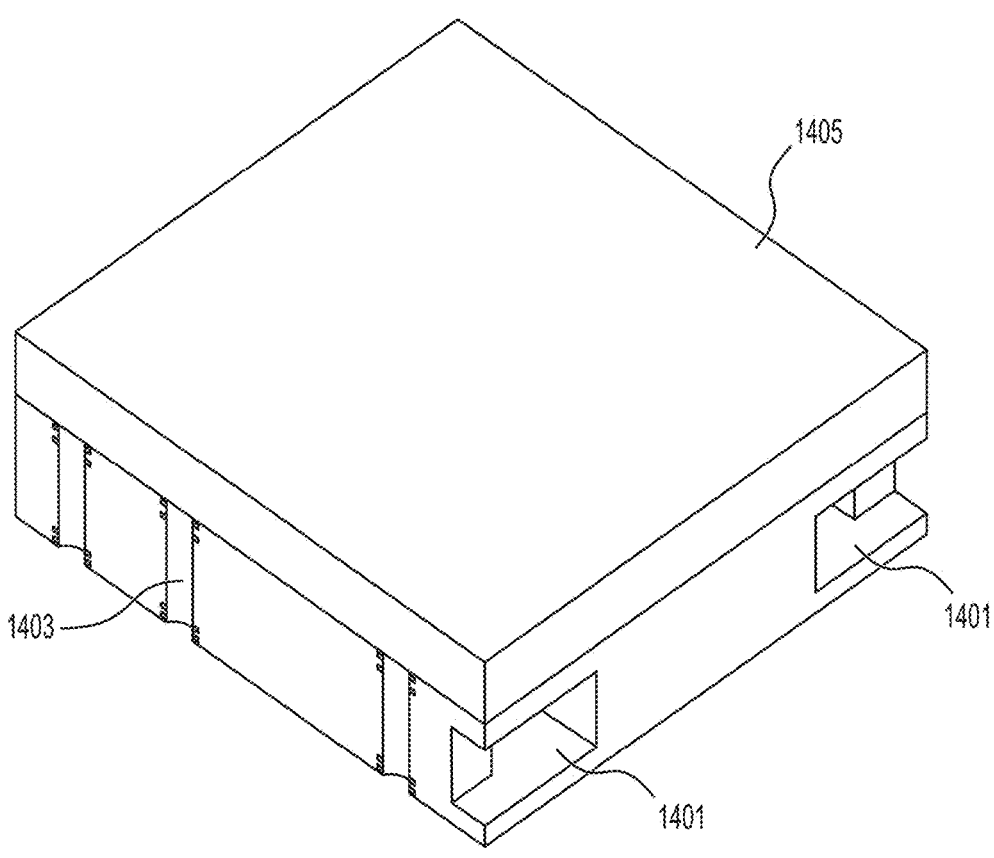
FIG. 12 shows the circuit module shown in FIG. 4 with an encapsulant covering the top surface of the circuit module.
Figure 13:
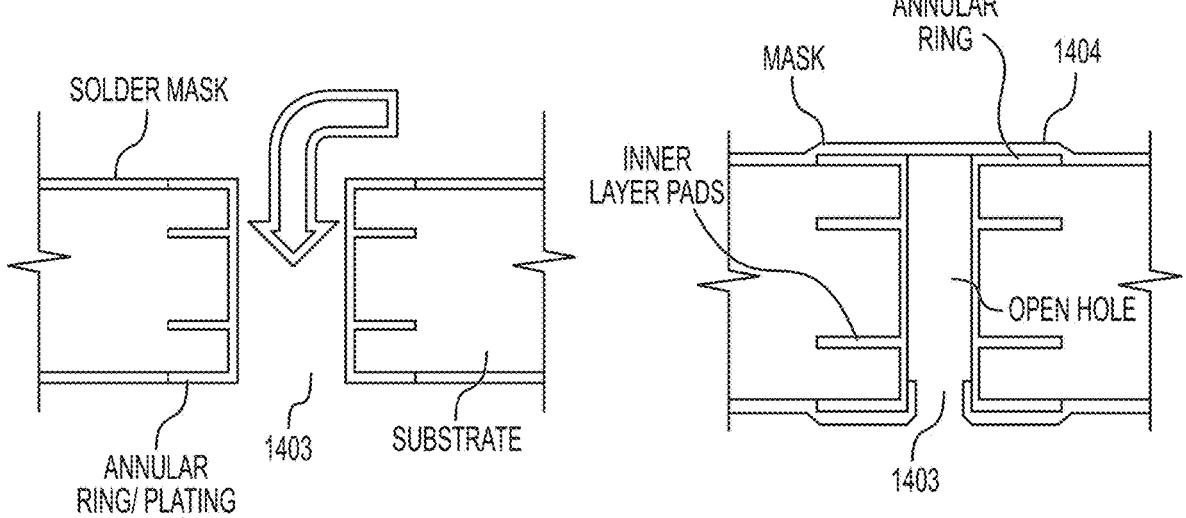
FIG. 13 shows a through hole with a cover.
Figure 17:
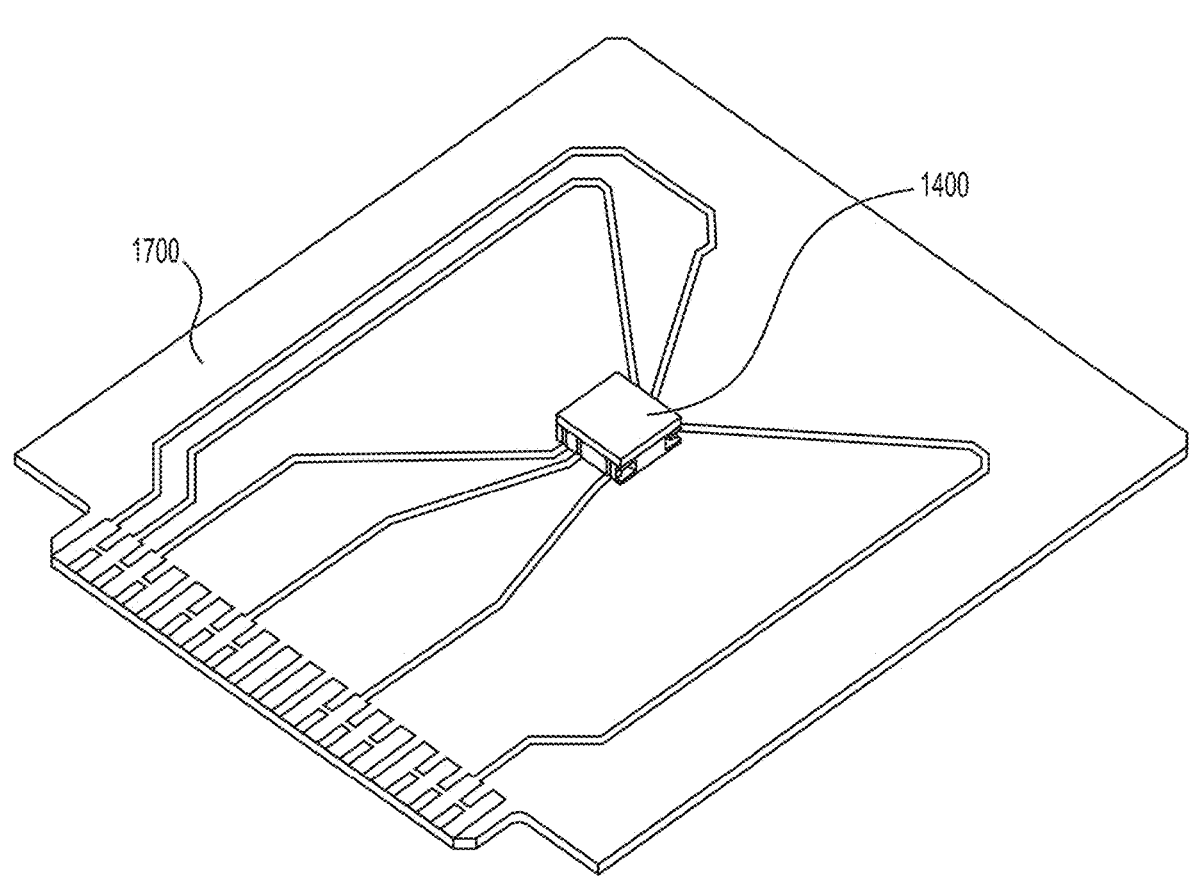
FIG. 17 shows the circuit module of FIG. 12 mounted to a host substrate.

FIG. 12 shows a modification to the circuit module 1400 shown in FIG. 4 to include an encapsulant 1405. Any suitable encapsulant can be used and can include, for example, resin. FIG. 13 shows a cover 1404 being added to the through holes of the circuit module 1400. Accordingly, by including the cover 1404, the one or more side nodes 1403 can be provided with a "tented" or "plugged" structure that prevents a filling or encapsulating material (for example, resin) from entering the through hole defining the one or more side nodes 1403, as shown in FIG. 13. As shown in FIG. 17, the circuit module 1400 can be mounted to a host substrate 1700, which can be, for example, an edge card.

Figure 14:
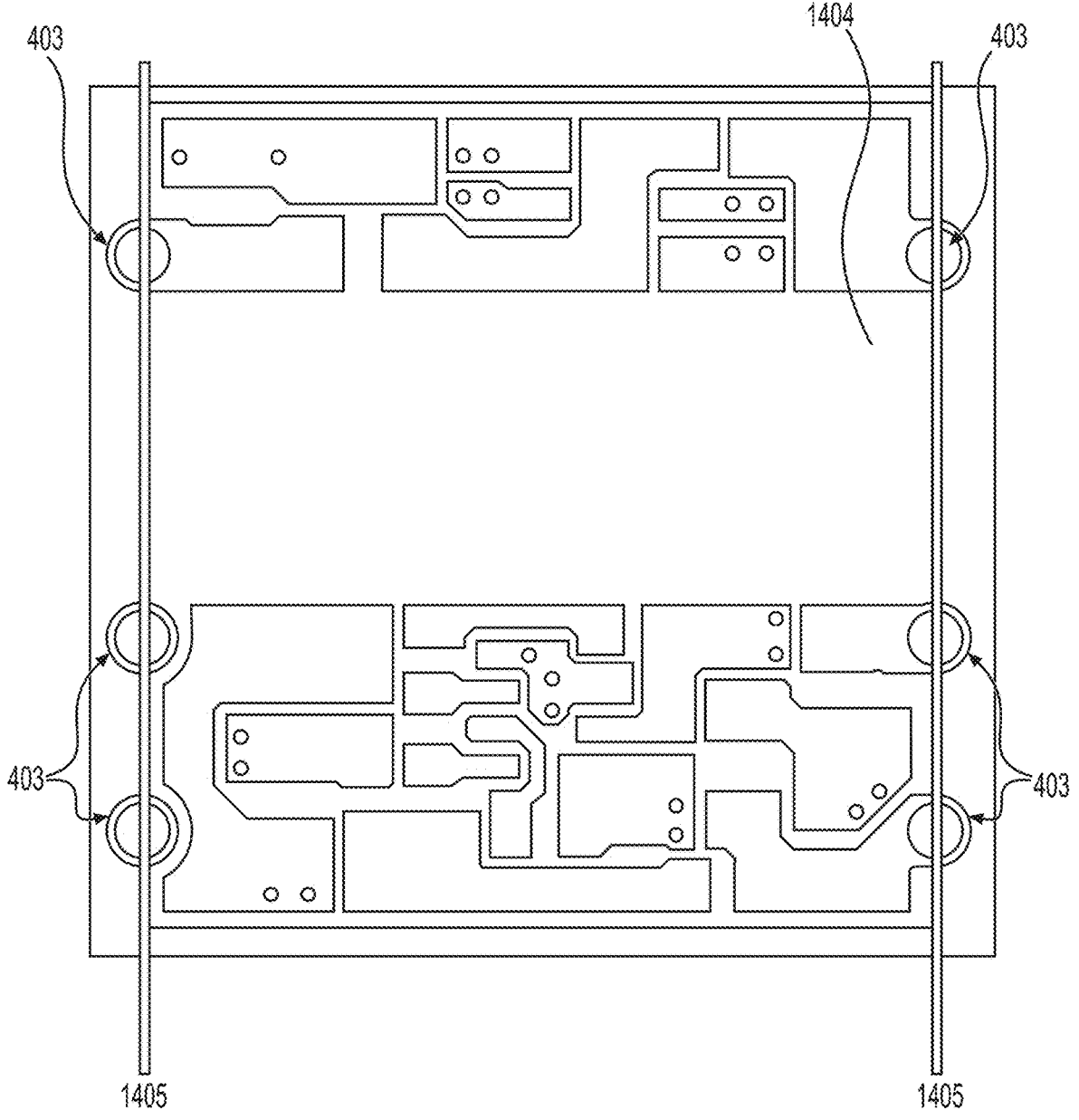
FIG. 14 shows an example of a manufacturing step of the circuit module shown in FIG. 12.
Figure 15:
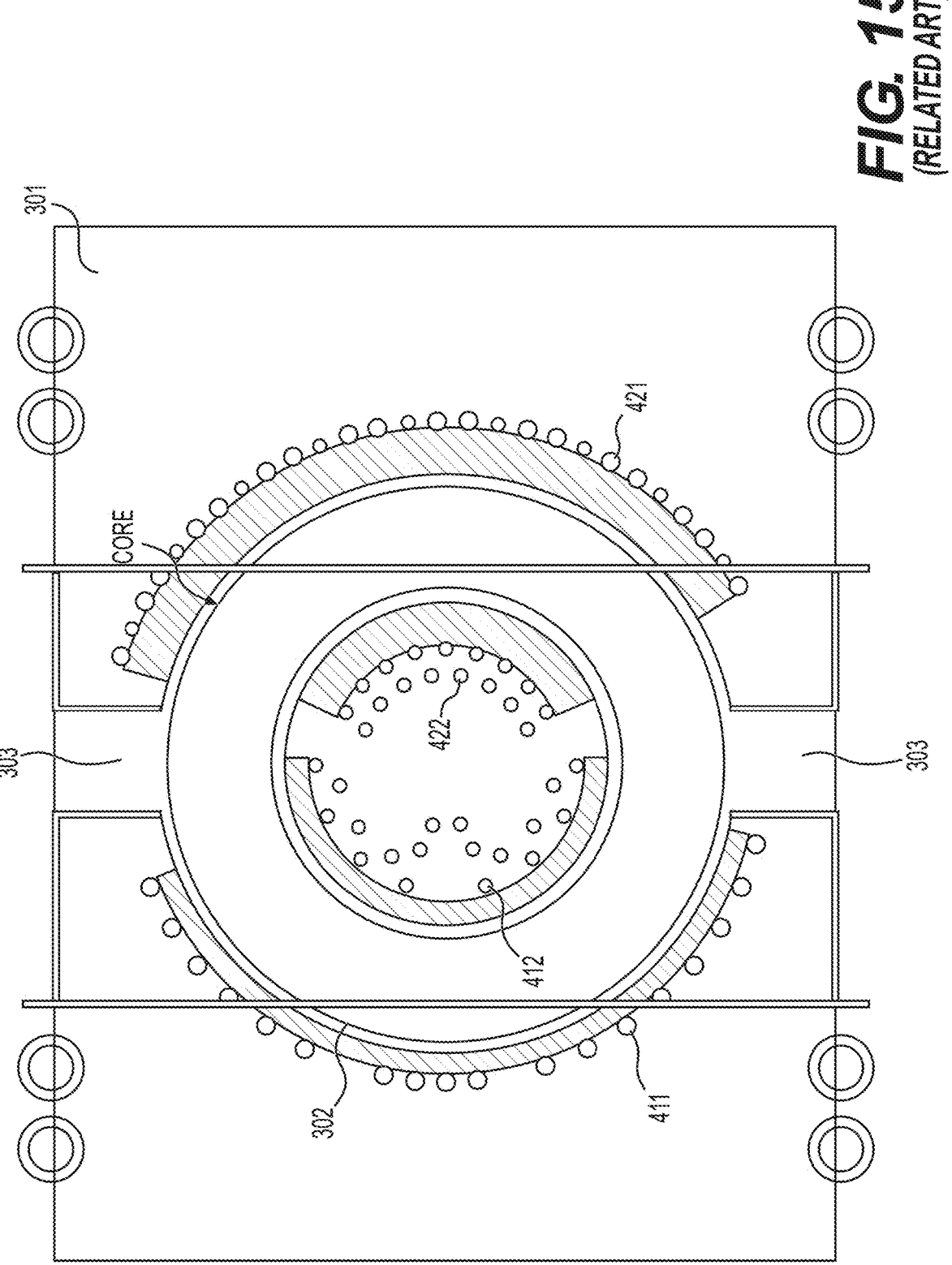
FIG. 15 shows a sectional plan view of the circuit module of the related art.

FIG. 14 shows an example of a manufacturing step of the modification to the circuit module 1400 shown in FIGS. 12 and 13. As shown in FIG. 14, the one or more side nodes 1403 are initially provided as through holes in the circuit module 1400. The cover 1404 is then placed on the circuit module 1400, and both the circuit module 1400 and the cover 1404 are cut along lines 1405, which pass through each of the one or more side nodes 1403. After cutting through each of the one or more side nodes 1403, a shape in a plan view of each of the one or more side nodes 1403 is defined as a partial circle or the like, thereby providing castellated holes for each of the one or more side nodes 1403.

Figure 18:
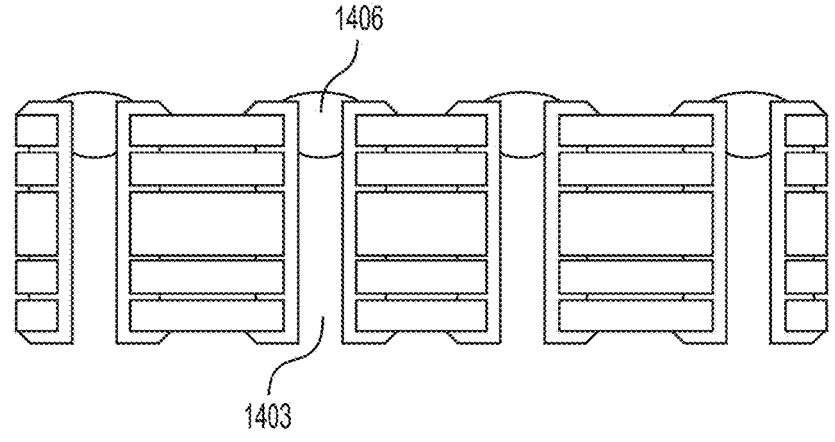
FIG. 18 show an alternative arrangement in which the through holes are covered with plugs.

As an alternative to the modification shown in FIGS. 12-14, instead of including the cover 1404, one end of each of the one or more side nodes 1403 may be plugged by a resin material or the like. FIG. 18 shows an alternative arrangement that includes plugs 1406 for each of the one or more side nodes 1403. Accordingly, by providing the plugs 1406, each of the one or more side nodes 1403 can be provided as a castellated hole without having to cover the circuit module 1400.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. An embedded magnetic component device comprising:
   an insulating substrate including a side node located on an edge of the insulating substrate and including a cavity; and
   a magnetic core in the cavity, wherein
   the insulating substrate includes a first opening and a second opening that connect the cavity to an exterior of the insulated substrate, and
   the first opening and the second opening are provided on a same side of the magnetic core.

2. The embedded magnetic component device of claim 1, wherein the first opening and the second opening are provided along a same edge of the insulating substrate.

3. The embedded magnetic component device of claim 1, wherein the side node includes an electrically conductive material.

4. The embedded magnetic component device of claim 1, wherein a cover is disposed over a first end of the side node.

5. The embedded magnetic component device of claim 1, further comprising an encapsulant provided on the insulating substrate.

6. A method of manufacturing an embedded magnetic component device, the method comprising:
   forming a cavity in an insulating substrate;
   forming a first channel between the cavity and a first edge of the insulating substrate;
   forming a second channel between the cavity and the first edge of the insulating substrate;
   installing a magnetic core in the cavity;
   forming an electrically conductive hole in the insulating substrate;
   forming a cover on the insulating substrate that covers the electrically conductive hole; and
   cutting the insulating substrate and the cover along a line that passes through the electrically conductive hole.

* * * * *